(12) United States Patent
Wiesel

(10) Patent No.: US 7,966,041 B2
(45) Date of Patent: Jun. 21, 2011

(54) PIN MOUNTING OF CAMERA MODULE IN A RADIO COMMUNICATION TERMINAL

(75) Inventor: Tobias Wiesel, Bjarred (SE)

(73) Assignee: Sony Ericsson Mobile Communications AB, Lund (SE)

( * ) Notice: Subject to any disclaimer, the term of this patent is extended or adjusted under 35 U.S.C. 154(b) by 655 days.

(21) Appl. No.: 12/022,192

(22) Filed: Jan. 30, 2008

(65) Prior Publication Data

US 2009/0191912 A1 Jul. 30, 2009

(51) Int. Cl.
*H04B 1/08* (2006.01)
*H04W 88/02* (2009.01)

(52) U.S. Cl. ............ 455/557; 455/575.1; 455/90.3; 455/348; 455/349

(58) Field of Classification Search .............. None
See application file for complete search history.

(56) References Cited

U.S. PATENT DOCUMENTS

| | | | |
|---|---|---|---|
| 6,731,952 B2 * | 5/2004 | Schaeffer et al. | 455/557 |
| 7,361,880 B2 * | 4/2008 | Webster | 257/727 X |
| 7,392,071 B2 * | 6/2008 | Pan | 455/556.1 X |
| 2003/0214028 A1 | 11/2003 | Brechignac et al. | |
| 2005/0122419 A1 | 6/2005 | Yoon | |
| 2005/0219398 A1 | 10/2005 | Sato et al. | |
| 2005/0237637 A1 | 10/2005 | Lung | |
| 2006/0014563 A1 | 1/2006 | Cheng | |

FOREIGN PATENT DOCUMENTS

| | | |
|---|---|---|
| EP | 0 585 186 | 3/1994 |
| JP | 2001-188155 | 7/2001 |

OTHER PUBLICATIONS

International Search Report for corresponding Application No. PCT/EP2008/058992 mailed Oct. 24, 2008.
Written Opinion for corresponding Application No. PCT/EP2008/058992 mailed Oct. 24, 2008.
International Preliminary Report on Patentability for corresponding Application No. PCT/EP2008/058992, date of completion of this report Apr. 8, 2010.

* cited by examiner

*Primary Examiner* — Philip J Sobutka
(74) *Attorney, Agent, or Firm* — Renner, Otto, Boisselle & Sklar, LLP

(57) ABSTRACT

The present invention involves a radio communication terminal comprising a camera module and an information receiving device, wherein said camera module comprise at least one mounting opening, said radio communication terminal further comprise at least one pin, which is connected to said information receiving device, and at least one resilient member, and said pin is adapted to be inserted into said mounting opening of said camera module and to interact with said resilient member to lock the camera module to the information receiving device.

17 Claims, 4 Drawing Sheets

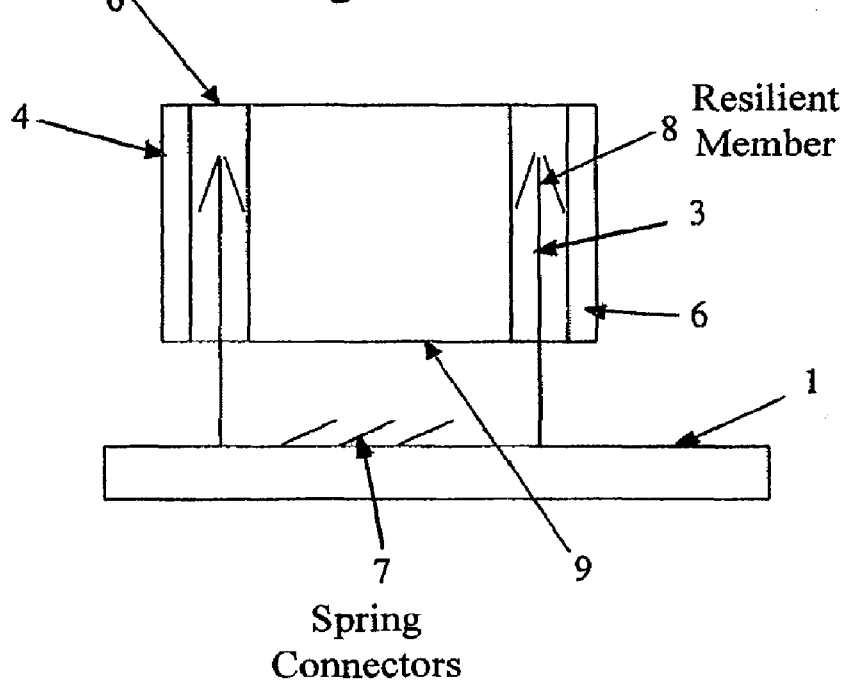
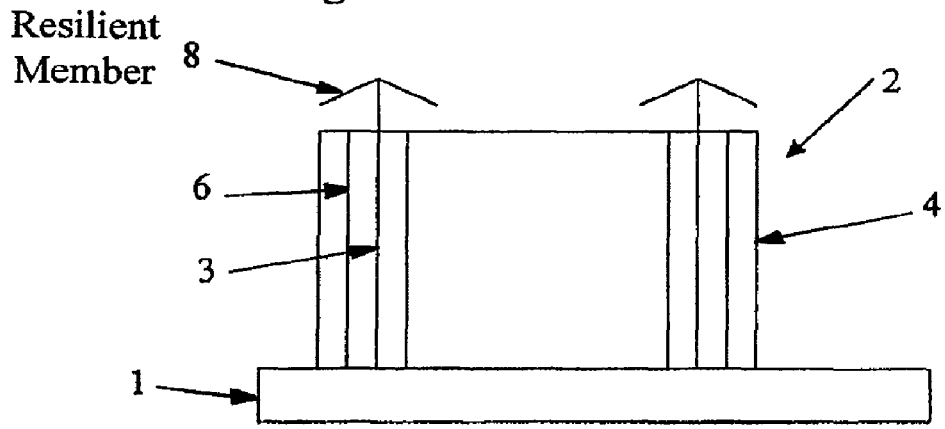

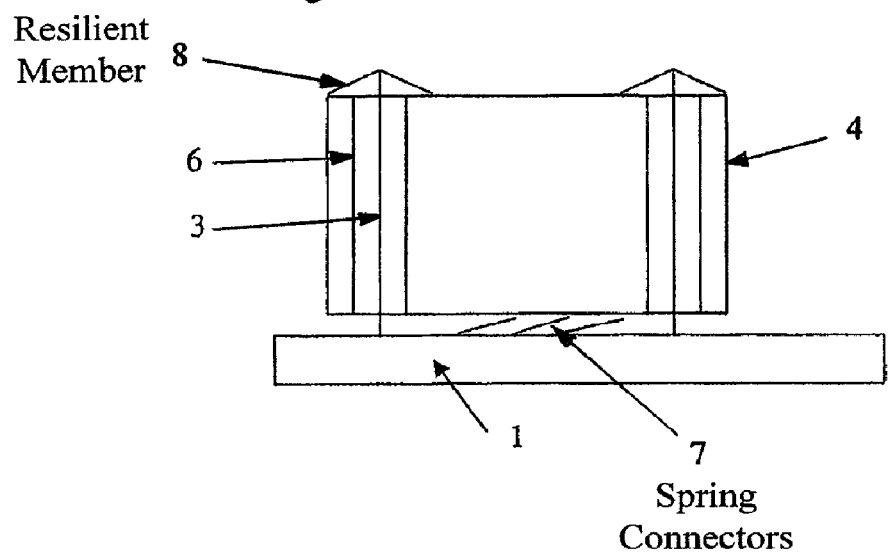
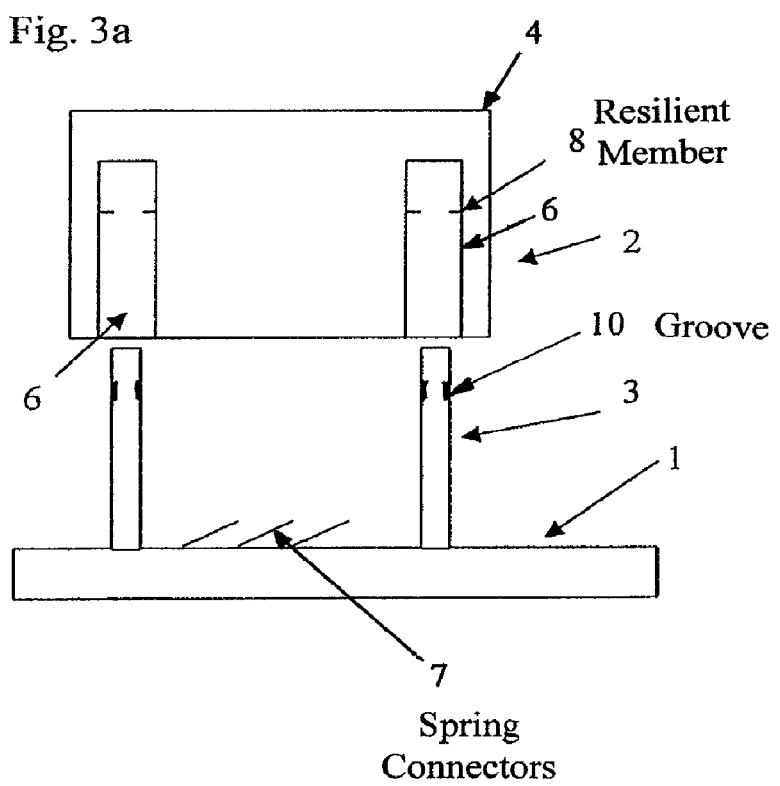

PIN MOUNTING OF CAMERA MODULE IN A RADIO COMMUNICATION TERMINAL

TECHNICAL FIELD

The present invention relates to a radio communication terminal comprising a camera module and an information receiving device.

BACKGROUND ART

The first commercially attractive cellular telephones or terminals were introduced in the market at the end of the 1980's. Since then, a lot of effort has been made in making smaller radio communication terminals, with much help from the miniaturisation of electronic components and the development of more efficient batteries. Today, numerous manufacturers offer pocket-sized radio communication terminals with a wide variety of capabilities and services, such as a camera.

In order to attract customers the terminal manufacturers have therefore taken further measures to strengthen their position in the competition. Size and cost is getting more and more essential in mobile handsets design. The marked trend is that mobile handsets are getting thinner. One limiting factor for the phone thickness is the built in camera.

One way of mounting the camera module in the radio communication terminal is by the use of camera sockets.

When the cameras get smaller the socket mechanics also decrease in size. This makes spring connectors that electronically connect the camera module to the printed circuit board thinner and more fragile. During mounting of such a camera module, there is a risk that the spring connectors are bent in a way that will short circuit the spring connectors.

SUMMARY OF THE INVENTION

A radio communication terminal defined in claim 1 is provided according to the present invention.

More specifically the invention relates to a radio communication terminal comprising a camera module and an information receiving device, wherein said camera module comprise at least one mounting opening, said radio communication terminal further comprise at least one pin, which is connected to said information receiving device, and at least one resilient member, and said pin is adapted to be inserted into said mounting opening of said camera module and to interact with said resilient member to lock the camera module to the printed circuit board.

By locking the camera module to the information receiving device according to this, the need for a socket is eliminated and the outer dimensions of the camera module is also the outer dimensions of the camera module mounted on a information receiving device.

A further advantage is that the dimensions of radio communication terminal could be reduced due to that the dimensions of the mounted camera module is reduced.

Another advantage is that the camera module is mounted in an easier way, as the pin guides the camera module, which reduces the risk of damaging any components during mounting.

The interaction between the pin and the resilient member can be adapted to detachably lock the camera module to the information receiving device. By doing this the camera module could be replaced or repaired in an easy and inexpensive way.

To reduce the number of loose parts the resilient member can be mounted on said pin. This also reduces the time and costs during manufacturing and assembly.

Another way to reduce the number of loose parts is that the resilient member can be mounted in said mounting opening.

To enhance the guiding of the camera module during assembly and to enlarge the possible contact surface between the camera module and the pin, the mounting opening can be a through hole.

The information receiving device can be a printed circuit board

The resilient member can be a barb, which is mounted on the pin. This is an efficient and secure way of connecting the resilient member to the pin.

To reduce the number of connectors between the camera module and the information receiving device, the pin can be adapted to ground the information receiving device.

To further reduce the risk of damages or mistakes during manufacturing and assembly the camera module can comprise four mounting openings.

The information receiving device and said camera module can be adapted to communicate via spring connectors, and wherein said spring connectors are adapted to interact with said resilient member to lock the camera module to the information receiving device. By doing this the resilient locking force between the camera module and the information receiving device is increased. The interaction also reduces the risk of an interruption in the communication between the camera module and the printed information receiving device.

BRIEF DESCRIPTION OF THE DRAWINGS

The features and advantages of the present invention will be more apparent from the following description of the preferred embodiments with reference to the accompanying drawings, in which

FIG. 2b is a schematically cross section of a camera module and a information receiving device according to a first embodiment during a first assemble state.

FIG. 2c is a schematically cross section of a camera module and a information receiving device according to of a first embodiment during a second assemble state.

FIG. 2d is a schematically cross section of a camera module and a information receiving device according to a first embodiment after assembly.

FIG. 3a is a schematically cross section of a camera module and a information receiving device according to a second embodiment in an unassembled state.

DETAILED DESCRIPTION

The present description relates to the field of radio communication terminals. The term radio terminal or communication terminal includes all mobile equipment devised for radio communication with a radio station, which radio station also may be mobile terminal or e.g. a stationary base station.

Consequently, the term radio terminal includes mobile telephones, pagers, communicators, electronic organisers, smartphones, PDA:s (Personal Digital Assistants) and DECT terminals (Digital Enhanced Cordless Telephony).

Furthermore, it should be emphasised that the term comprising or comprises, when used in this description and in the appended claims to indicate included features, elements or steps, is in no way to be interpreted as excluding the presence of other features elements or steps than those expressly stated.

Figure 1:
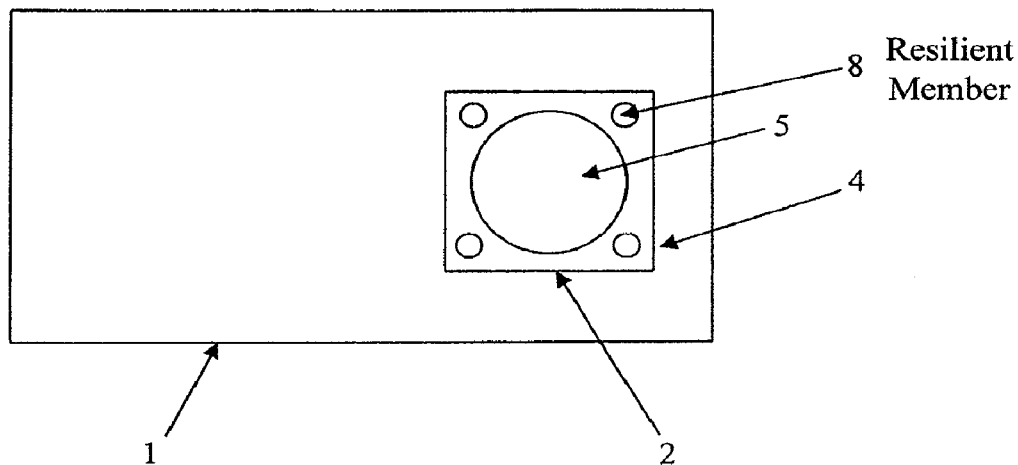
FIG. 1 illustrates a camera module mounted on a information receiving device of a radio communication terminal

Exemplary embodiments will now be described with references made to the accompanying drawings. FIG. 1 discloses an information receiving device 1, a camera module 2 and pins 3 (not shown in FIG. 1) of a radio communication terminal (not shown).

Figure 2A:
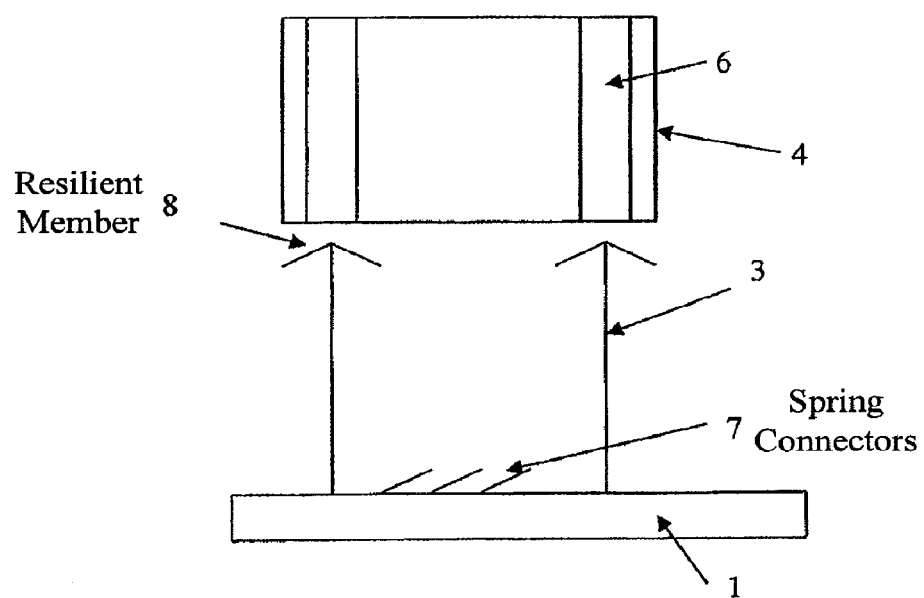
FIG. 2a is a schematically cross section of a camera module and a information receiving device according to a first embodiment in an unassembled state.

With reference to FIGS. 1 and 2, the camera module 2 comprises a camera house 4, a lens 5, mounting openings 6 and a communication module 9. The camera house 4 has a cubic shape. The lens 5 is arranged in the centre of one side of the camera house 4. The mounting openings 6 are arranged in the corners of the camera house 4.

The information receiving device 1 is a printed circuit board 1. The printed circuit board 1 comprises spring connectors 7. The spring connectors are adapted to make contact with the communication module 9 of the camera module 2, such that the camera module 2 and the printed circuit board 1 can communicate with each other.

A first embodiment will hereafter be described with reference to FIG. 2a-2d. The mounting openings 6 are through holes in the camera house 4. On one end the pins 3 are connected to the printed circuit board 1. A resilient member 8 is connected to the other end of the pin 3. The resilient member 8 has the shape of a barb that is pointed towards the printed circuit board.

To lock the camera module 2 to the printed circuit board 1, the pins 3 and the resilient members 8 are inserted in the mounting openings 6. The dimensions of the resilient members 8 are wider than the mounting openings 6 and as they are inserted into the mounting openings they will flex towards the pin 3. The pins 3 guide the camera module 2 towards the correct position on the printed circuit board 1.

When the camera module 2 is moved towards the printed circuit board 1, the communication module 9 makes contact with the spring connectors 7 and press them towards the printed circuit board 1. The pin 3 is now fully inserted into the mounting openings 6. The resilient member 8 has gone through the mounting opening 6. As the resilient member 8 exits the mounting openings it flexes back and once again the dimension thereof is wider than the mounting openings 6.

The camera module 2 is thereafter pressed upwards by the spring connectors 7. As the camera module 2 is moved upwards the barbs of the resilient members 8 makes contact with the camera house 4 and prevent it from further upward movement. The camera module 2 is now locked to the printed circuit board 1.

The camera module 2 could be detached from the printed circuit board 1 by pressing the camera module 2 and the spring connectors 7 towards the printed circuit board 1. Thereafter the resilient members 8 are pressed against the pin 3. The camera module 2 is moved away from the printed circuit board 1 and the pins 3 and the resilient members 8 are removed from the mounting openings 6 of the camera house 4. The camera module 2 is now detached and could be repaired or replaced.

Figure 3B:
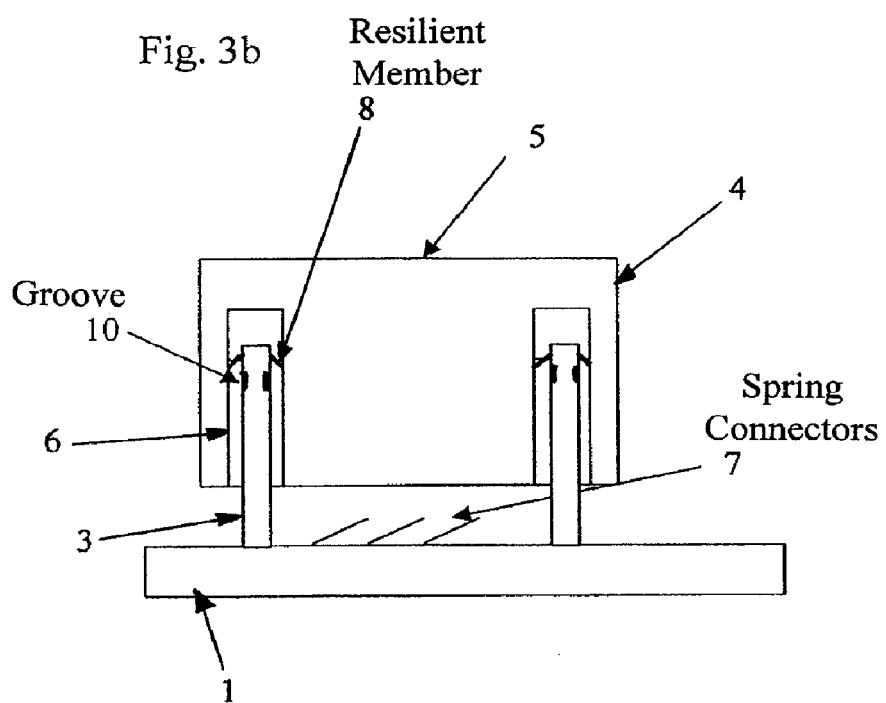
FIG. 3b is a schematically cross section of a camera module and a information receiving device according to a second embodiment during assemble.
Figure 3C:
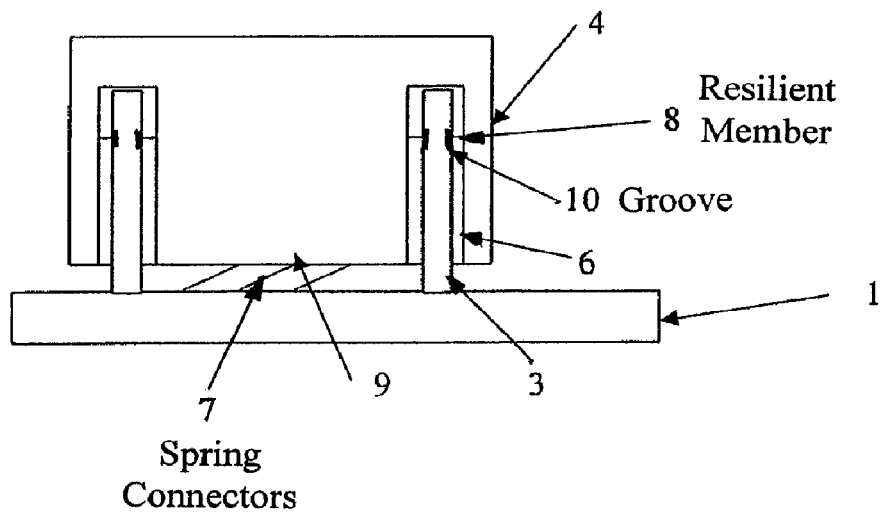
FIG. 3c is a schematically cross section of a camera module and a information receiving device according to a second embodiment after assembly.

A second embodiment is disclosed in FIG. 3a-3c to which reference is made. The pins 3 are connected to the printed circuit board 1 in a first end. A circumferential groove 10 is arranged at a second end of the pins 3.

The resilient member 8 has the shape of a ring. The resilient member 8 is arranged on the inside of the mounting opening 6 as a circumferential rim.

To lock the camera module 2 to the printed circuit board 1, the pins 3 are inserted into the mounting openings 6. As the camera module 2 is moved towards the printed circuit board 1 the pins 3 guide the movement. The outer diameter of the pin 3 is larger than the inner diameter of the ring shaped resilient member 8. As the pin 3 makes contact with the resilient member 8, the resilient members 8 will flex away from the printed circuit board 1. When the camera module 2 is moved further towards the printed circuit board 1, the pins 3 will be pressed trough the resilient member 8 and the resilient member 8 will flex back into the circumferential groove 10 of the pin 3. As the camera module 2 has been moved towards the printed circuit board 1 the communication module 9 of the camera module 2 has made contact with and pressed the spring connectors 7 towards the printed circuit board 1. The camera module 2 is now locked to the printed circuit board 1.

As the spring connectors 7 are pressed towards the communication module 9 a secure and good connection between the camera module 2 and the printed circuit board 1 is achieved.

To detach the camera module 2 from the printed circuit board 1, the camera module 2 is moved upwards. When the upward force is larger than the resilient force of the resilient member 8, the resilient member 8 will flex and the camera module 2 could be detached.

The pins 3 can be connected to ground on the printed circuit board 1 to reduce the number of spring connectors.

The barbed pins 3 could go straight through as in the first embodiment or stay inside the camera module 2 with the goal to lock the camera module 2 in position.

The principles of the present invention have been described in the foregoing by examples of embodiments or modes of operations. However, the invention should not be construed as being limited to the particular embodiments discussed above, which are illustrative rather than restrictive, and it should be appreciated that variations may be made in those embodiments by persons skilled in the art, without departing from the scope of the present invention as defined by the appended claims.

The invention claimed is:

1. A radio communication terminal comprising a camera module and an information receiving device, wherein
   said camera module comprising at least one mounting opening, wherein the mounting openings are at least one hole in the lower side of said camera module;
   said radio communication terminal further comprising at least one pin, which is connected to said information receiving device, and at least one resilient member, and
   said pin is adapted to be inserted into said hole of said camera module, wherein said resilient member exerts a resilient force on said pin, locking said pin in said hole, wherein the camera module is detachably locked to the information receiving device.

2. A radio communication terminal according to claim 1, wherein said interaction between the pin and the resilient member is adapted to detachably lock the camera module to the information receiving device.

3. A radio communication terminal according to claim 1, wherein said resilient member is mounted on said pin.

4. A radio communication terminal according to claim 1, wherein said information receiving device is a printed circuit board.

5. A radio communication terminal according to claim 1, wherein said resilient member is mounted in said mounting opening.

6. A radio communication terminal according to claim 1, wherein said mounting opening is a through hole.

7. A radio communication terminal according to claim 1, wherein the resilient member is a barb, which is mounted on the pin.

8. A radio communication terminal according to claim 1, wherein the pin is adapted to ground the information receiving device.

9. A radio communication terminal according to claim 1, wherein said camera module comprises four mounting openings.

10. A radio communication terminal according to claim 1, wherein said information receiving device and said camera module is adapted to communicate via spring connectors, and wherein said spring connectors are adapted to interact with said resilient member to lock the camera module to the information receiving device.

11. A radio communication terminal according to claim 1, wherein said resilient member is near an end of said pin.

12. A radio communication terminal according to claim 11, wherein said resilient member is at an end of said pin remote from the information receiving device.

13. A radio communication terminal according to claim 11, wherein said resilient member comprises a plurality of resilient members.

14. A radio communication terminal according to claim 1, wherein said resilient member is in the hole.

15. A radio communication terminal according to claim 1, wherein said resilient member acts to apply force between the hole and the pin.

16. A radio communication terminal according to claim 1, wherein said resilient member acts to apply force between the hole and the pin near the end of the pin.

17. A radio communication terminal according to claim 1, wherein said resilient member acts to apply force between an end portion of the pin and the hole.

\* \* \* \* \*